(12) United States Patent
Priddy et al.

(10) Patent No.: US 6,505,956 B1
(45) Date of Patent: Jan. 14, 2003

(54) REELED L.E.D. ASSEMBLY

(75) Inventors: G. Robert Priddy, Tulsa, OK (US); Kevin W. Hannah, Tulsa, OK (US); James C. Slayden, Talala, OK (US)

(73) Assignee: Lektron Industrial Supply, Inc., Tulsa, OK (US)

( * ) Notice: Subject to any disclaimer, the term of this patent is extended or adjusted under 35 U.S.C. 154(b) by 0 days.

(21) Appl. No.: 09/748,536

(22) Filed: Dec. 22, 2000

(51) Int. Cl.$^7$ ................................................ F21V 21/00
(52) U.S. Cl. ...................... 362/249; 362/252; 362/800; 362/812
(58) Field of Search ................................ 313/500, 511; 362/238, 249, 800, 252, 812; 340/815.45

(56) References Cited

U.S. PATENT DOCUMENTS

| | | | | |
|---|---|---|---|---|
| 4,591,954 A | * | 5/1986 | Kawamura et al. | ......... 362/800 |
| 4,761,720 A | * | 8/1988 | Solow | ......... 362/252 |
| 5,660,461 A | * | 8/1997 | Ignatius et al. | ......... 362/249 X |
| 6,042,248 A | * | 3/2000 | Hannah et al. | ............. 362/252 |

* cited by examiner

Primary Examiner—Stephen Husar
(74) Attorney, Agent, or Firm—Frank J. Catalano

(57) ABSTRACT

A reeled L.E.D. lighting system has a plurality of rigid circuit boards, each circuit board having a plurality of light emitting diodes dispersed on one face thereof, the diodes being electrically connected between positive and negative terminals of their respective circuit board, the circuit boards being electrically connected in parallel with each other and structurally connected in series with each other by a plurality of pairs of flexible conductors connecting the positive and negative terminals of the circuit boards, the structural series connection providing a chain of the circuit boards and conductors, the chain being spirally wound about a spool of a reel for every dispersion into and attachment to a light housing.

14 Claims, 2 Drawing Sheets

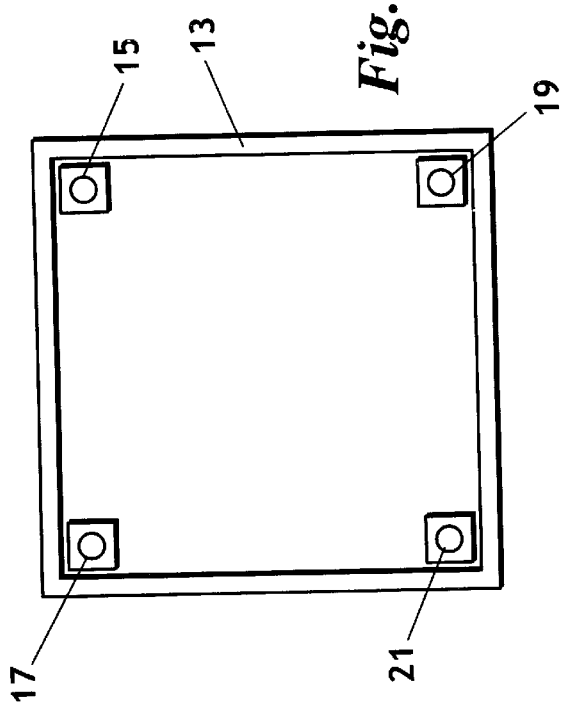
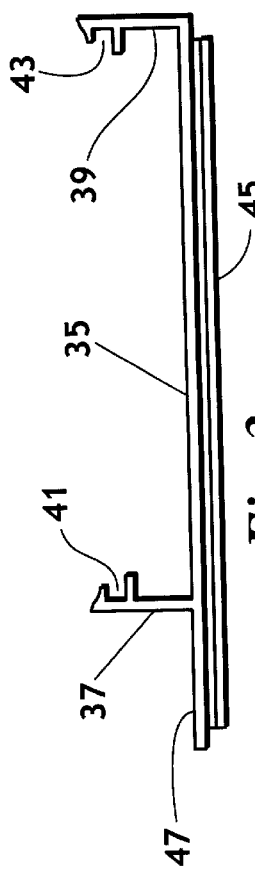
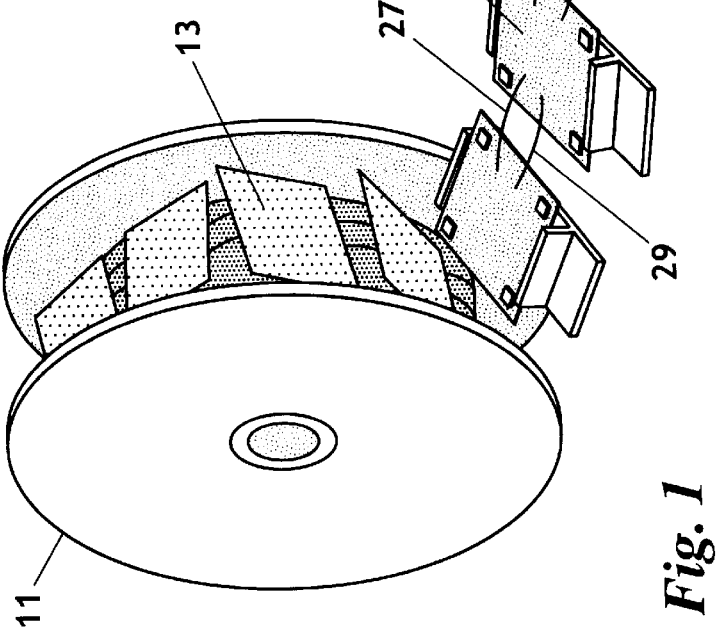

REELED L.E.D. ASSEMBLY

BACKGROUND OF THE INVENTION

This invention relates generally to light systems using light emitting diodes and more particularly concerns a pre-engineered, pretracked reeled L.E.D. system for lighting signs.

PRIOR ART CONCERNS

Some known L.E.D. lighting systems use long circuit boards with many L.E.D.'s distributed along the length of the board. The long circuit boards are generally not suitable for use in lighting housings which require curved or direction changing patterns of lights. If they are short enough to accommodate the space limitations resulting from changes in direction, they still must be separately mounted in channel clips before being secured in the housing. They also require calculation of the sizes of transformers, resistors and other circuit components necessary to handle each specific application. They must then also be wired in to the configuration of the system.

Other L.E.D. systems utilize metal tracks which can be bent to fit housings of various shapes, but the current boards must still be separately mounted in the track and then wired in the housing. These systems also require in-field mounting of the circuit boards on appropriate channel clips, fastening of the circuit boards in the housing and calculation of transformer sizes, resistors and other circuit components to accommodate the specific application. Boxes of circuit boards, channel clips, wiring and associated circuit elements complicate the task. The spacing of the boards and clips to achieve proper light distribution must be calculated and measured. Essentially, every application presents a unique design and assembly problem.

It is, therefore, an object of this invention to provide an L.E.D. system which is pre-engineered to provide a suitable light intensity per unit area. Another object of this invention is to provide an L.E.D. system which is pre-engineered to include all necessary circuit elements including properly sized transformers and resistors. A further object of this invention is to provide an L.E.D. system which is preassembled in a multi-directionally flexible array for rapid and easy installation in housings of any shape. Yet another object of this invention is to provide an L.E.D. system which is preassembled to include all necessary circuit board channel clips and attaching tape or the like. It is also an object of this invention to provide an L.E.D. system which uses the conductors electrically connecting the circuit boards as flexible structural connections between the circuit boards. Still another object of this invention is to provide an L.E.D. system which is connected in a flexible array for easy storage on and distribution from a reel.

SUMMARY OF THE INVENTION

In accordance with the invention, a lighting system includes a plurality of rigid circuit boards. Each of the circuit boards has a plurality of light emitting diodes dispersed on one of its faces. The diodes are electrically connected between the positive and negative terminals of their respective circuit board. The circuit boards are electrically connected in parallel with each other and structurally connected in series with each other by a plurality of pairs of flexible conductors connecting the positive and negative terminals of the circuit boards. The structural series connection results in a chain of circuit boards and conductors in a continuous circuit which is then spirally wound about the spool of a reel. The continuous circuit of boards is easily dispensed and aligned in the light housing. The system further includes a plurality of channel clips, one grasping each of the circuit boards, and a plurality of segments of double-backed adhesive, one adhered to each of the channel clips for easy mounting of the dispensed boards in the housing. Each of the clips may have a tab extending from an edge parallel to the direction of the chain to facilitate handling the chain during installation.

Each circuit board has at least one resistor electrically connected in series with its light emitting diodes sized to limit current through the diodes to a predetermined value. The light emitting diodes are preferably dispersed on their respective circuit boards in a geometric pattern predetermined to disperse light evenly over a predetermined geometric area. The geometric patterns are consistent from board to board and pre-engineered to provide a desired light intensity over the known geometric area. The circuit components are pre-calculated to limit the current in each circuit board.

The channel clips and adhesive are preassembled in the chain. The chain is flexible so as to follow the contour of the housing. Therefore, installation requires only dispensing the chain, pressing the adhesive of the clips to the housing and cutting the conductors at the last board to be used in the chain.

Most preferably, the light emitting diodes of each of the circuit boards are dispersed in the same geometric pattern with the diodes which are aligned in the direction of the length of the chain being dispersed at equal intervals. The pairs of conductors are of equal length, the length being predetermined to space all the diodes which are aligned in the direction of the length of the chain at equal intervals in a direction transverse to the length of the chain. Preferably, the light emitting diodes of each circuit board are also dispersed at equal intervals. The most preferred geometric pattern is a square. Such an arrangement permits the installer to use parallel chains, spacing all the transversely aligned diodes across the chains equally in housings having widths in multiples of the coverage of a single chain.

BRIEF DESCRIPTION OF THE DRAWINGS

Other objects and advantages of the invention will become apparent upon reading the following detailed description and upon reference to the drawings in which:

FIG. 1 is a perspective view of a pre-engineered, pre-tracked reeled L.E.D. system;

FIG. 2 is a top plan view of a typical circuit board used in the system of FIG. 1;

FIG. 3 is a front elevation view of a typical channel clip used in the system of FIG. 1;

DETAILED DESCRIPTION

Figure 5:
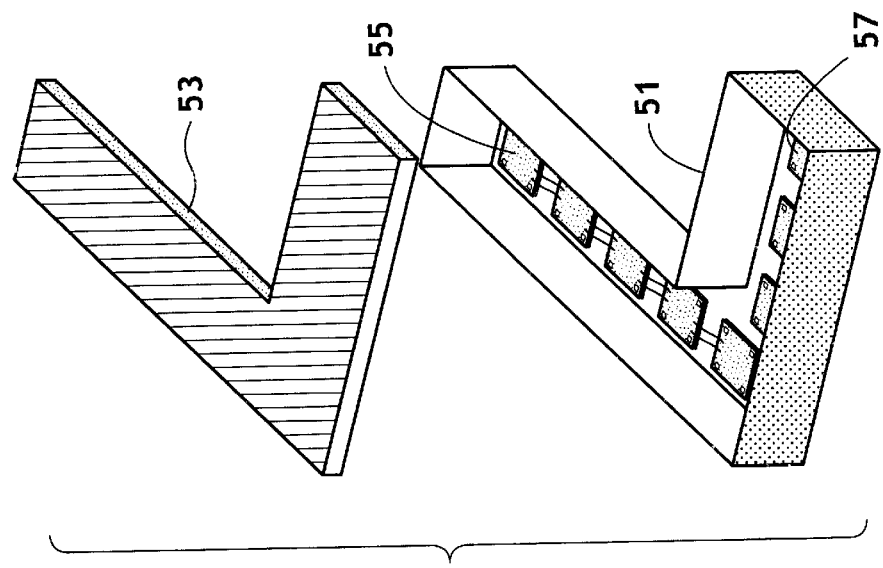
FIG. 5 is a perspective view of a length of light chain dispensed from a reel and mounted in an L-shaped light housing While the invention will be described in connection with a preferred embodiment, it will be understood that it is not intended to limit the invention to that embodiment. On the contrary, it is intended to cover all alternatives, modifications and equivalents as may be included within the spirit and scope of the invention as defined by the appended claims.
Figure 4:
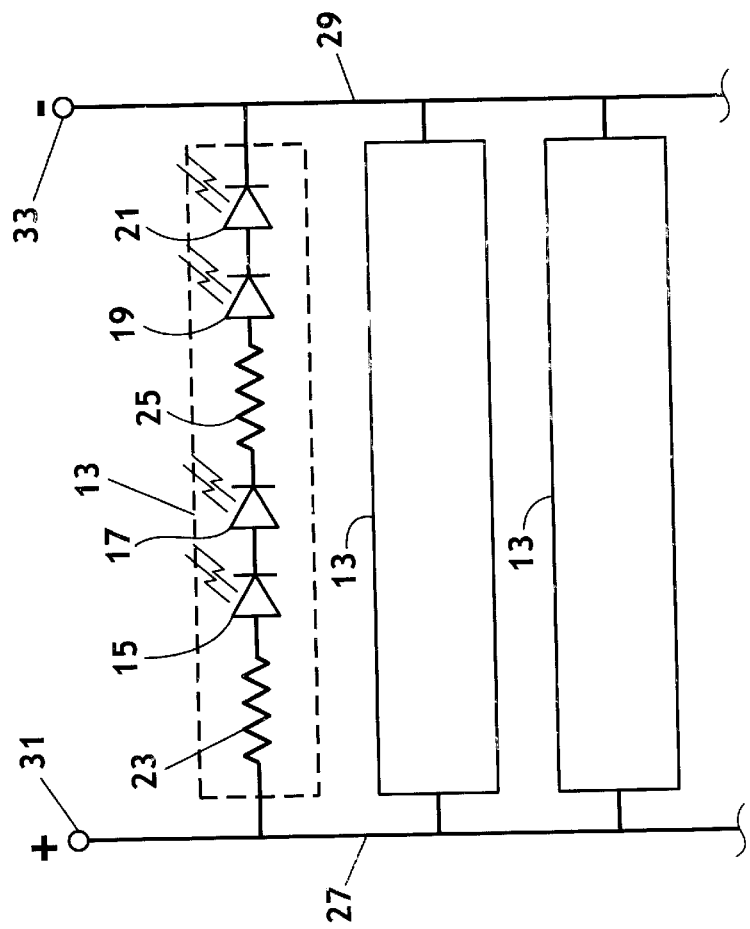
FIG. 4 is a schematic diagram of the electrical circuit of the system of FIG. 1.

Turning to FIG. 1, a preferred embodiment of the reeled L.E.D. lighting system is illustrated. The reel 11 stores a spirally wound chain forming a continuous lighting circuit. The chain consists of a plurality of circuit boards 13, each having a plurality of L.E.D.'s 15,17, 19 and 21, as can best be seen in FIG. 2. Looking at FIG. 4, the diodes 15, 17, 19 and 21 of each circuit board 13 are series connected with resistors 23 and 25. Pairs of conductors 27 and 29 connect each of the boards 13 in parallel to positive and negative terminals 31 and 33 on each circuit board 13. The circuit boards 13 are also structurally connected in series with each other by the conductors 27 and 29. The conductors 27 and 29 are flexible so that the interconnection of conductors 27 and 29 and circuit boards 13 provides a chain of circuit boards 13 and conductors 27 and 29, the chain being spirally wound about the spool of the reel 11. Each of the circuit boards 13 is mounted on a channel clip. As shown in FIG. 3, each clip has a base 35 supporting a pair of uprights 37 and 39. The uprights 37 and 39 support opposing channels 41 and 43 which grip opposite edges of the circuit boards 13. Each of the clips has a segment of double backed adhesive tape 45 on its outer face and may also have a tab 47 extending from its base 35. As can best be seen in FIG. 1, the clips are preferably engaged with the uprights 37 and 39 parallel to the chain and the tabs 47 extending parallel to the chain.

As shown, the circuit boards 13 support the L.E.D.'s 15, 17, 19 and 21 in the geometric pattern of a square. The edgewise spacing between the diodes 15,17, 19 and 21 is selected to disperse light over a predetermined geometric area. Each of the circuit boards 13 has its light emitting diodes 15,17,19 and 21 dispersed in the same geometric pattern. The length of the conductors 27 and 29 connecting sequential circuit boards 13 is chosen to provide a consistent lighting distribution along the chain. Preferably, the conductors are of equal length, the length being selected so that the lengthwise spacing of all of the diodes taken in a direction along the length of the chain will be equal. Thus, the system stored on the reel can be designed to cover a predetermined width of housing with diodes spaced to provide a known level of light intensity. The square pattern of L.E.D.'s is preferred because parallel chains can then be used to evenly distribute light over housings which are widthwise multiples of the predetermined light coverage of a single chain. The installer then need only space the parallel claims so as to equally spread the traverse arrays of L.E.D.'s to correctly configure the system.

Various geometric patterns of L.E.D.'s can be employed, deliberately varying the intensity of light provided along the chain. Any number of diodes may be dispersed on the boards with the number and sizes of resistors calculated to properly limit the current in the circuit of each board.

An eight board chain is shown in an L-shaped letter housing 51 which is to be closed by an L-shaped lens cover 53. Installation requires only that the first board 55 be adhered in place in the housing 51 and the chain unreeled until the last board 57 needed in the housing 51 is in place. The flexible conductors permit the chain to conform to the L-shape. The conductors at the furthest end of the last board 57 are cut and all the boards secured in place by the double-backed tape. The system is ready to be connected to a suitable power source.

In the prototype system, 135 boards were used to form a 45 linear foot chain. Four L.E.D.'s were dispersed in 2 inch by 2 inch patterns on each of the boards, the boards being 2.5 inches square. The length of the conductors was selected to provide 1.5 inches between boards so that all the L.E.D.'s of the chain are on 2 inch centers.

Thus, it is apparent that there has been provided, in accordance with the invention, a reeled L.E.D. system that fully satisfies the objects, aims and advantages set forth above. While the invention has been described in conjunction with a specific embodiment thereof, it is evident that many alternatives, modifications and variations will be apparent to those skilled in the art and in light of the foregoing description. Accordingly, it is intended to embrace all such alternatives, modifications and variations as fall within the spirit of the appended claims.

What is claimed is:

1. A lighting system comprising a plurality of rigid circuit boards, each of said circuit boards having a plurality of light emitting diodes dispersed on one face thereof, said diodes being electrically connected between first and second terminals on their respective circuit board, said circuit boards being electrically connected in parallel with each other and structurally connected in series with each other by a plurality of pairs of flexible conductors connecting said first and second terminals of said circuit boards, said structural series connection providing a flexible chain of said circuit boards and conductors.

2. A lighting system according claim 1 further comprising a plurality of channel clips, one engaged with each of said circuit boards.

3. A lighting system according to claim 2 further comprising a plurality of segments of double-backed adhesive, one adhered to each of said channel clips.

4. A lighting system according to claim 1, each said circuit board having at least one resistor electrically connected in series with said light emitting diodes of its respective circuit board, said at least one resistor being sized to limit current through its said diodes to a predetermined value.

5. A system according to claim 1, said light emitting diodes being dispersed on their respective circuit boards in a geometric pattern predetermined to disperse light over a predetermined geometric area.

6. A system according to claim 5, said light emitting diodes of each of said circuit boards being dispersed in said geometric pattern.

7. A system according to claim 6, said light emitting diodes of each said circuit board aligned in a direction of a length of said chain being dispersed at equal intervals.

8. A system according to claim 7, said pairs of conductors being of equal length.

9. A system according to claim 8, said conductor length being predetermined to space all said diodes of said plurality of circuit boards aligned in a direction of a length of said chain at equal intervals.

10. A system according to claim 6, said light emitting diodes of each said circuit board aligned in a direction transverse to a length of said chain being dispersed at equal intervals.

11. A system according to claim 5, said geometric pattern being a square.

12. A system according to claim 11, said conductors being of a length predetermined to disperse said light emitting diodes at equal intervals along a length of said chain.

13. A system according to claim 1, said chain being spirally wound about a spool of a reel.

14. A lighting system comprising a plurality of rigid circuit boards, each of said circuit boards having a plurality of light emitting diodes dispersed on one face thereof, said diodes being electrically connected between first and second terminals on their respective circuit board, said circuit boards being electrically connected in parallel with each other and structurally connected in series with each other by a plurality of pairs of flexible conductors connecting said first and second terminals of said circuit boards, said structural series connection providing a flexible chain of said circuit boards and conductors and a plurality of channel clips, one engaged with each of said circuit boards, each of said clips having a tab extending from an edge thereof parallel to a direction of said chain.

* * * * *

UNITED STATES PATENT AND TRADEMARK OFFICE
CERTIFICATE OF CORRECTION

PATENT NO.    : 6,505,956 B1                                              Page 1 of 1
DATED         : January 14, 2003
INVENTOR(S)   : G. Robert Priddy, Kevin W. Hannah and James C. Slayden It is certified that error appears in the above-identified patent and that said Letters Patent is hereby corrected as shown below:

<u>Title page,</u>
Item [75], Inventors replace "Priddy" with -- Preddy --.

Signed and Sealed this

Twentieth Day of May, 2003

JAMES E. ROGAN
*Director of the United States Patent and Trademark Office*